United States Patent
Kang

(10) Patent No.: US 9,324,396 B2
(45) Date of Patent: Apr. 26, 2016

(54) SEMICONDUCTOR APPARATUS AND OPERATING METHOD THEREOF

(71) Applicant: SK hynix Inc., Icheon-si Gyeonggi-do (KR)

(72) Inventor: Kyeong Pil Kang, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 14/255,543

(22) Filed: Apr. 17, 2014

(65) Prior Publication Data

US 2015/0236675 A1 Aug. 20, 2015

(30) Foreign Application Priority Data

Feb. 17, 2014 (KR) .................. 10-2014-0017729

(51) Int. Cl.
*G11C 7/22* (2006.01)
*G11C 7/08* (2006.01)
*G11C 7/06* (2006.01)

(52) U.S. Cl.
CPC *G11C 7/22* (2013.01); *G11C 7/065* (2013.01); *G11C 7/08* (2013.01)

(58) Field of Classification Search
CPC .......... G11C 16/26; G11C 16/10; G11C 7/12; G11C 16/12; G11C 11/24; G11C 11/41; G11C 11/56; H03K 17/16; H03K 17/161; H03K 17/162; H03K 17/145
USPC .......................... 327/108, 109, 110, 111, 112
See application file for complete search history.

(56) References Cited

U.S. PATENT DOCUMENTS

| 5,570,058 A * | 10/1996 | Maruyama .................... 327/404 |
| 2006/0050589 A1* | 3/2006 | Choi et al. ..................... 365/226 |
| 2009/0027090 A1* | 1/2009 | Vo ............................ G11C 7/10 327/108 |

FOREIGN PATENT DOCUMENTS

KR 1020130064374 A 6/2013

* cited by examiner

*Primary Examiner* — John Poos
(74) *Attorney, Agent, or Firm* — William Park & Associates Ltd.

(57) ABSTRACT

A sense amplifier control circuit of a semiconductor apparatus includes a driving unit configured to apply a first voltage to a sense amplifier in response to a first driving signal. The driving unit may also be configured to apply a second voltage to the sense amplifier in response to a second driving signal. In addition, the driving unit may also be configured to apply a third voltage to the sense amplifier in response to a third driving signal. A switching unit may be configured to electrically couple a first node to a second node in response to a control signal. The first driving signal is output to the first node, and the second driving signal is output to the second node.

18 Claims, 5 Drawing Sheets

SEMICONDUCTOR APPARATUS AND OPERATING METHOD THEREOF

CROSS-REFERENCES TO RELATED APPLICATION

The present application claims priority under 35 U.S.C. §119(a) to Korean application number 10-2014-0017729, filed on Feb. 17, 2014, in the Korean Intellectual Property Office, which is incorporated herein by reference in its entirety.

BACKGROUND

1. Technical Field

Various embodiments relate to a semiconductor apparatus, and more particularly, to a circuit for controlling a sense amplifier of a semiconductor apparatus.

2. Related Art

A semiconductor apparatus may store data in response to a request from an exterior. When a semiconductor apparatus is volatile, the semiconductor apparatus may include an SRAM (static random access memory) or a DRAM (dynamic random access memory).

SUMMARY

In an embodiment, a sense amplifier control circuit of a semiconductor apparatus may include a driving unit configured to apply a first voltage to a sense amplifier in response to a first driving signal. The driving unit may also be configured to apply a second voltage to the sense amplifier in response to a second driving signal. In addition, the driving unit may be configured to apply a third voltage to the sense amplifier in response to a third driving signal. The semiconductor apparatus may also include a switching unit configured to electrically couple a first node to a second node in response to a control signal. The first driving signal may be output to the first node and the second driving signal may be output to the second node.

In an embodiment, a sense amplifier control circuit of a semiconductor apparatus may include a signal generation unit configured to output a first driving signal to a first node in response to a first enable signal and a control signal. The signal generation unit may also be configured to output a second driving signal to a second node in response to a second enable signal and the control signal. The sense amplifier circuit may also include a switching unit configured to electrically couple the first node and the second node in response to the control signal.

In an embodiment of the invention, a method for operating a sense amplifier control circuit of a semiconductor apparatus may include outputting from a signal generation unit an enabled first driving signal to a first node. The method may also include applying a first voltage by a driving unit to a sense amplifier in response to the first driving signal. In addition, the method may include electrically coupling the first node and a second node by a switching unit. The method may also include outputting an enabled second driving signal from the signal generation unit to the second node. Further, the method may include applying a second voltage by the driving unit to the sense amplifier in response to the second driving signal.

DETAILED DESCRIPTION

Hereinafter, a semiconductor apparatus and an operating method thereof will be described below with reference to the accompanying drawings through various embodiments. A semiconductor apparatus may generate internal voltages of various levels which are needed inside by using an external voltage, to then use the generated internal voltages. For example, the semiconductor apparatus may generate a core voltage needed to amplify a bit line, and then use the generated core voltage. The semiconductor apparatus may also generate a boosting voltage which may compensate for a loss in the threshold voltage of a transistor, and use the generated boosting voltage. The semiconductor apparatus may include internal voltage generation circuits to generate the respective internal voltages. A semiconductor apparatus trends to be developed to operate at a higher processing speed and consume less power. When a semiconductor apparatus consumes less power, the burden exerted on internal voltage generation circuits included in the semiconductor apparatus may be lessened. In addition, the internal voltage generation circuits may be scaled down. Accordingly, a sense amplifier control circuit capable of reducing power consumption of a semiconductor apparatus is described herein.

Figure 1:
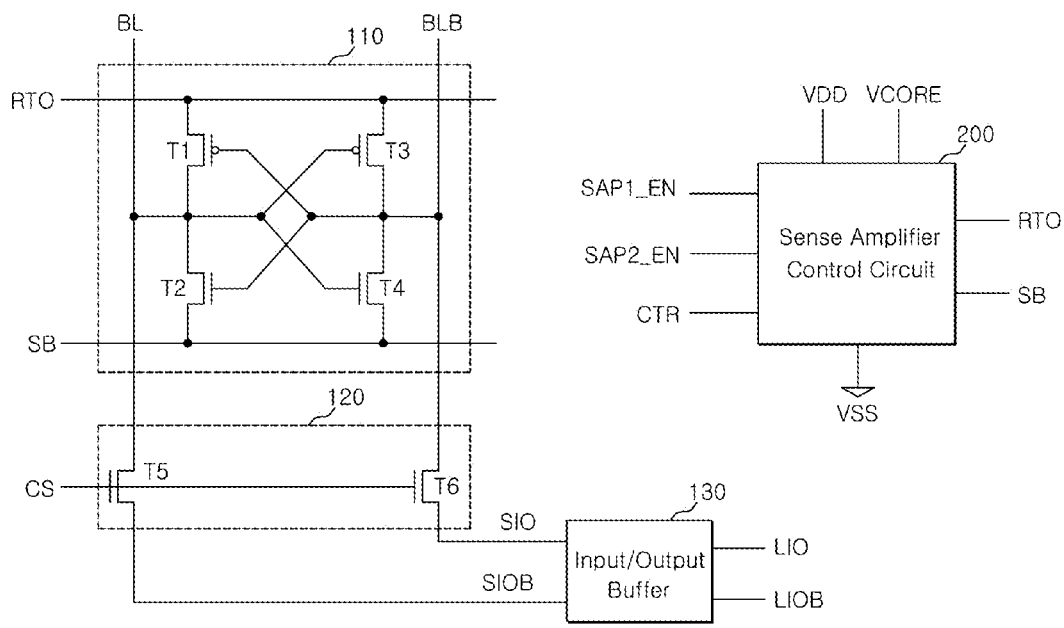
FIG. 1 is a block diagram schematically showing the configuration of a semiconductor apparatus including a sense amplifier control circuit in accordance with an embodiment of the invention.

Referring to FIG. 1, a block diagram schematically showing the configuration of a semiconductor apparatus 10 including a sense amplifier control circuit 200 in accordance with an embodiment of the invention is illustrated. Data transmission paths of the semiconductor apparatus 10 are schematically shown.

The semiconductor apparatus 10 may comprise the sense amplifier control circuit 200, a sense amplifier 110, a selection block 120, and an input/output buffer 130.

The sense amplifier control circuit 200 may apply a first voltage VDD or a second voltage VCORE to a pull-up node RTO and apply a third voltage VSS to a pull-down node SB. The sense amplifier control circuit 200 may apply the first voltage VDD, second voltage VCORE, or third voltage VSS in response to a first enable signal SAP1_EN, a second enable signal SAP2_EN and a control signal CTR. The sense amplifier control circuit 200 may use power used to enable an internal first driving signal to enable an internal second driving signal through charge sharing. Accordingly, the sense amplifier control circuit 200 may reduce power necessary to enable the second driving signal. The configuration of the sense amplifier control circuit 200 will be described with reference to FIGS. 2 and 3.

The sense amplifier 110 may be electrically coupled to a bit line BL and a bit bar line BLB. The sense amplifier 110 may include a plurality of transistors T1 to T4. When performing a read operation, the sense amplifier 110 may sense the voltage difference between the bit line BL and the bit bar line BLB. The voltage difference between the bit line BL and bit bar line BLB is caused by the data transferred from a memory cell (not shown) to the bit line BL. The sense amplifier 110 may amplify the voltage difference by using the first voltage VDD, the second voltage VCORE and the third voltage VSS applied from the pull-up node RTO and the pull-down node SB. The configuration and the operating principle of the sense amplifier 110 may be substantially the same as the configuration and the operating principle of a sense amplifier known in the art.

The selection block 120 may electrically couple the bit line BL with segment data line SIO and electrically couple the bit bar line BLB with segment data bar line SIOB according to a select signal CS. The selection block 120 may transfer the amplified data loaded on the bit line BL and the bit bar line BLB, to the segment data line SIO and the segment data bar line SIOB in response to the enabled select signal CS. The selection block 120 may include transistors T5 and T6 which operate according to the select signal CS.

The input/output buffer 130 may amplify the data transferred through the segment data line SIO and then transfer the amplified data to local data line LIO. The input/output buffer 130 may amplify the data transferred through the segment data bar line SIOB and then transfer the amplified data to local data bar line LIOB. The data transferred to the local data line LIO and the local data bar line LIOB may then be output to an exterior.

Paths through which a write operation is performed may be opposite to the paths through which the read operation is performed.

Figure 2:
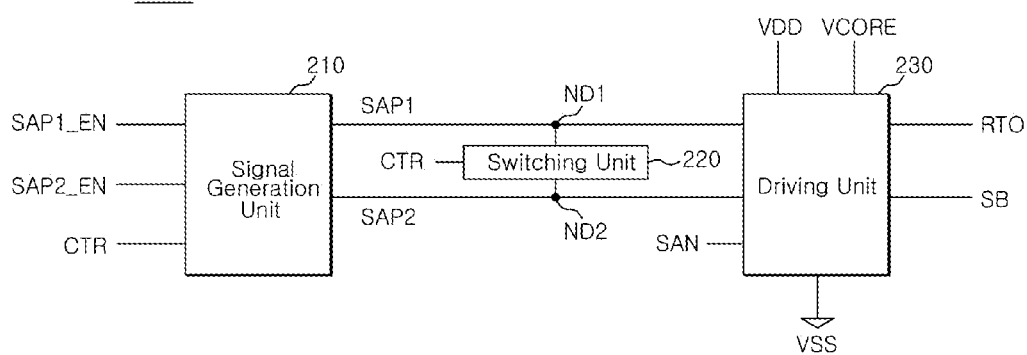
FIG. 2 is a block diagram schematically showing the sense amplifier control circuit shown in FIG. 1.

Referring to FIG. 2, a block diagram schematically showing the sense amplifier control circuit 200 shown in FIG. 1 is illustrated.

The sense amplifier control circuit 200 may comprise a signal generation unit 210, a switching unit 220, and a driving unit 230.

The signal generation unit 210 may output a first driving signal SAP1 to a first node ND1 in response to the first enable signal SAP1_EN and the control signal CTR. The signal generation unit 210 may also output a second driving signal SAP2 to a second node ND2 in response to the second enable signal SAP2_EN and the control signal CTR. The first enable signal SAP1_EN and the second enable signal SAP2_EN may be internally generated from signals transmitted from the exterior, to control the operation of the driving unit 230.

The signal generation unit 210 may output the second driving signal SAP2 in a disabled state the first driving signal SAP1 is outputted in an enabled state, in response to the first and second enable signals SAP1_EN and SAP2_EN. Further, the signal generation unit 210 may output the first driving signal SAP1 in a disabled state when the second driving signal SAP2 is outputted in an enabled state, in response to the first and second enable signals SAP1_EN and SAP2_EN. Moreover, the signal generation unit 210 may interrupt the output of the first driving signal SAP1 and the second driving signal SAP2 in response to the control signal CTR that is enabled.

The switching unit 220 may electrically couple the first node ND1 that the first driving signal SAP1 is output and the second node ND2 that the second driving signal SAP2 is output according to the control signal CTR. The switching unit 220 may be configured to form a current path from the first node ND1 to the second node ND2 when the control signal CTR is in the enabled state.

The driving unit 230 may apply the first voltage VDD to the pull-up node RTO in response to the first driving signal SAP1. The driving unit 230 may also apply the second voltage VCORE to the pull-up node RTO in response to the second driving signal SAP2. Further, the driving unit 230 may apply the third voltage VSS to the pull-down node SB in response to a third driving signal SAN. The level of the first voltage VDD may be greater than the level of the second voltage VCORE. The first voltage VDD may be an external voltage. The second voltage VCORE may be an internal voltage generated inside the semiconductor apparatus 10. The third voltage VSS may be a ground voltage. The third driving signal SAN may be internally generated from a signal transmitted from the exterior, to control the operation of the driving unit 230.

Figure 3:
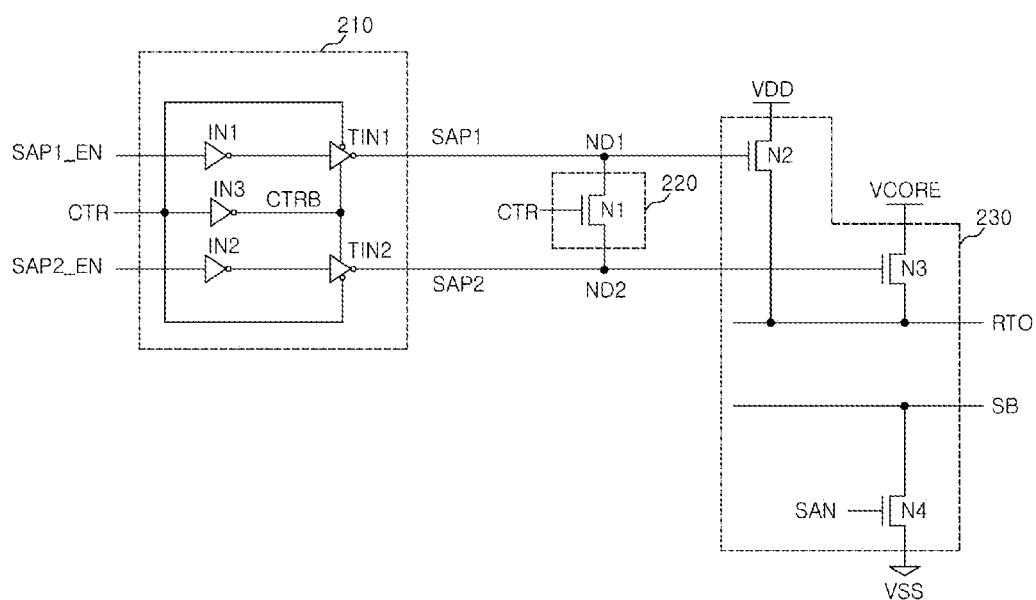
FIG. 3 is a circuit diagram showing in detail the sense amplifier control circuit shown in FIG. 2.

Referring to FIG. 3, a circuit diagram showing in detail the sense amplifier control circuit 200 shown in FIG. 2 is illustrated.

The signal generation unit 210 may comprise a first inverter IN1, a first tri-state inverter TIN1, a second inverter IN2, a second tri-state inverter TIN2, and a third inverter IN3. The first inverter IN1 may invert the first enable signal SAP1_EN. The first tri-state inverter TIN1 may also be inputted with the output of the first inverter IN1. The first tri-state inverter TIN1 may also output the first driving signal SAP1 to the first node ND1 according to the control signal CTR and an inverted control signal CTRB. The first tri-state inverter TIN1 may not output the first driving signal SAP1 when the control signal CTR is in the enabled state. The second inverter IN2 may invert the second enable signal SAP2_EN. The second tri-state inverter TIN2 may also be inputted with the output of the second inverter IN2. The second tri-state inverter TIN2 may also output the second driving signal SAP2 to the second node ND2 according to the control signal CTR and the inverted control signal CTRB. The second tri-state inverter TIN2 may also not output the second driving signal SAP2 when the control signal CTR is in the enabled state. The third inverter IN3 may invert the control signal CTR and output the inverted control signal CTRB.

The switching unit 220 may include a first transistor N1. The first transistor N1 may be applied with the control signal CTR through the gate and form the current path between the first node ND1 and the second node ND2.

The driving unit 230 may include second to fourth transistors N2 to N4.

The second transistor N2 may be applied with the first driving signal SAP1 through the gate, and form a current path between the terminal of the first voltage VDD and the pull-up node RTO. The second transistor N2 may supply the first voltage VDD to the pull-up node RTO according to the enabled first driving signal SAP1.

The third transistor N3 may be applied with the second driving signal SAP2 through the gate, and form a current path between the terminal of the second voltage VCORE and the pull-up node RTO. The third transistor N3 may supply the second voltage VCORE to the pull-up node RTO according to the enabled second driving signal SAP2.

The fourth transistor N4 may be applied with the third driving signal SAN through the gate, and form a current path between the pull-down node SB and the terminal of the third voltage VSS. The fourth transistor N4 may supply the third voltage VSS to the pull-down node SB according to the enabled third driving signal SAN.

Figure 4:
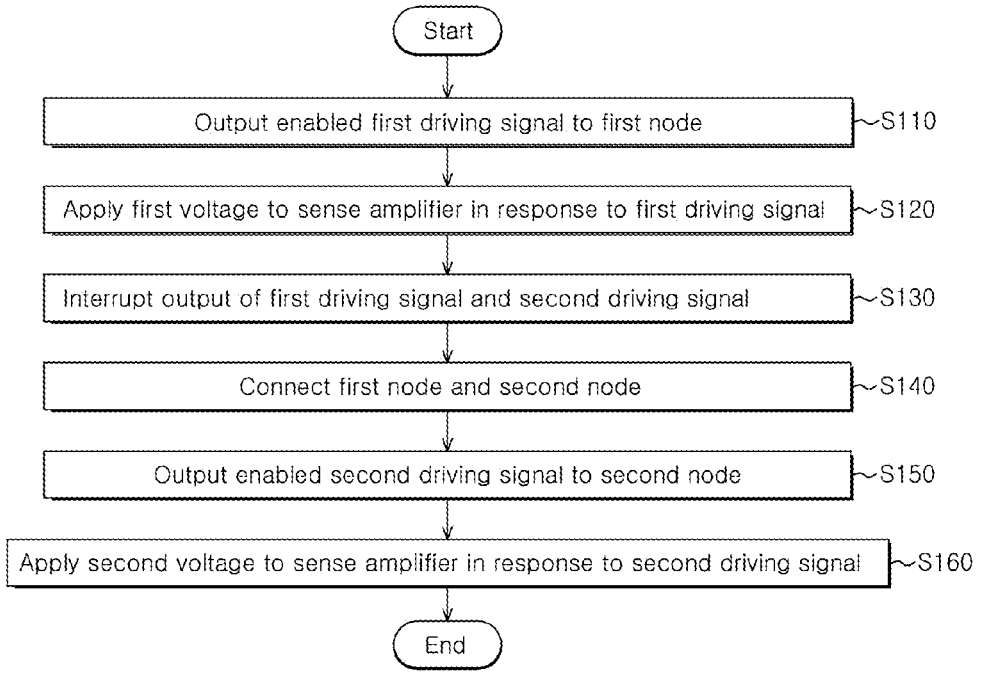
FIG. 4 is a flow chart explaining an operating method of the sense amplifier control circuit shown in FIG. 3.

Referring to FIG. 4, a flow chart explaining an operating method of the sense amplifier control circuit 200 shown in FIG. 3 is illustrated.

In step S110, when the first enable signal SAP1_EN is enabled, the first tri-state inverter TIN1 may then output the enabled first driving signal SAP1 to the first node ND1. The second enable signal SAP2_EN may be in the disabled state. In addition, the second tri-state inverter TIN2 may output the disabled second driving signal SAP2 to the second node ND2.

When the first and second tri-state inverters TIN1 and TIN2 output the first and second driving signals SAP1 and SAP2 to the first node ND1 and the second node ND2, the control signal CTR may be in a disabled state. In addition, the first node ND1 and the second node ND2 are released from being electrically coupled by the switching unit 220.

In step S120, the second transistor N2 may apply the first voltage VDD to the sense amplifier 110 that is shown in FIG. 1 through the pull-up node RTO according to the first driving signal SAP1.

In step S130, when the control signal CTR is enabled, the signal generation unit 210 may then interrupt the output of the first driving signal SAP1 and the second driving signal SAP2.

In step S140, when the control signal CTR is enabled, the switching unit 220 may then electrically couple the first node ND1 to the second node ND2. As the current path is formed from the first node ND1 to the second node ND2, charges may then be shared between the first node ND1 and the second node ND2.

In step S150, when the second enable signal SAP2_EN is enabled, the second tri-state inverter TIN2 may then output the enabled second driving signal SAP2 to the second node ND2. As a result, the first enable signal SAP1_EN may be in the disabled state at that time, and the first tri-state inverter TIN1 may then output the disabled first driving signal SAP1 to the first node ND1. When the first and second tri-state inverters TIN1 and TIN2 output the first and second driving signals SAP1 and SAP2 to the first node ND1 and the second node ND2, the control signal CTR may be in the disabled state. In addition, the first node ND1 and the second node ND2 are released from being electrically coupled by the switching unit 220.

In step S160, the third transistor N3 may apply the second voltage VCORE to the sense amplifier 110 through the pull-up node RTO according to the second driving signal SAP2.

Figure 5:
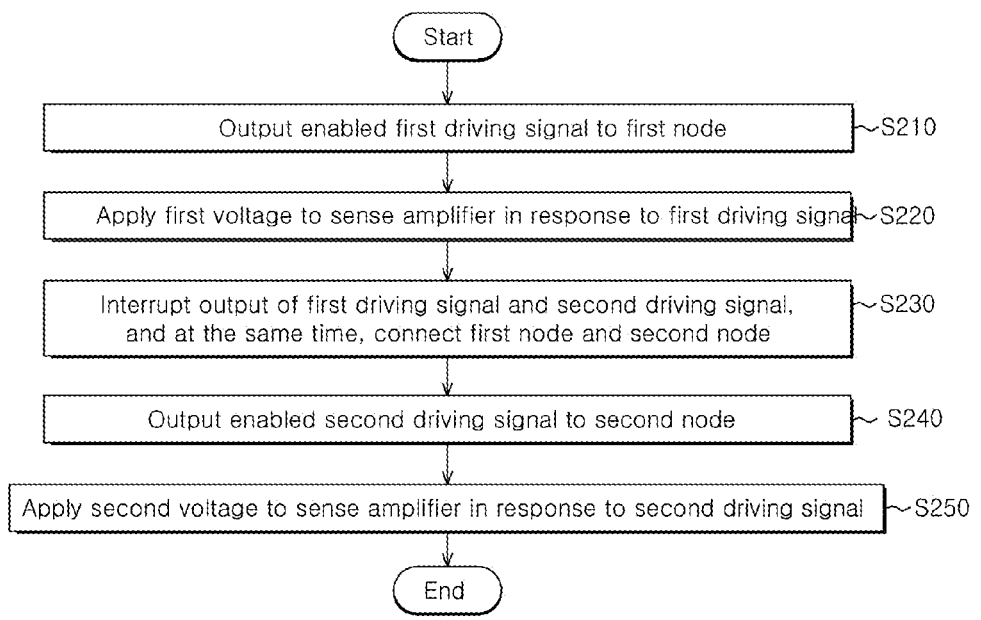
FIG. 5 is a flow chart explaining another operating method of the sense amplifier control circuit shown in FIG. 3.

In an embodiment, the step S130 and the step S140 may be simultaneously performed. More specifically, when the control signal CTR is enabled, the signal generation unit 210 may interrupt the output of the first driving signal SAP1 and the second driving signal SAP2. Further, the switching unit 220 may electrically couple the first node ND1 and the second node ND2. FIG. 5 is a flow chart explaining an operating method of the sense amplifier control circuit shown in FIG. 3. The operating method shown in FIG. 5 may be similar to the operating method shown in FIG. 4 except step S230 in which the step S130 and the step S140 of FIG. 4 may be simultaneously performed.

Figure 6:
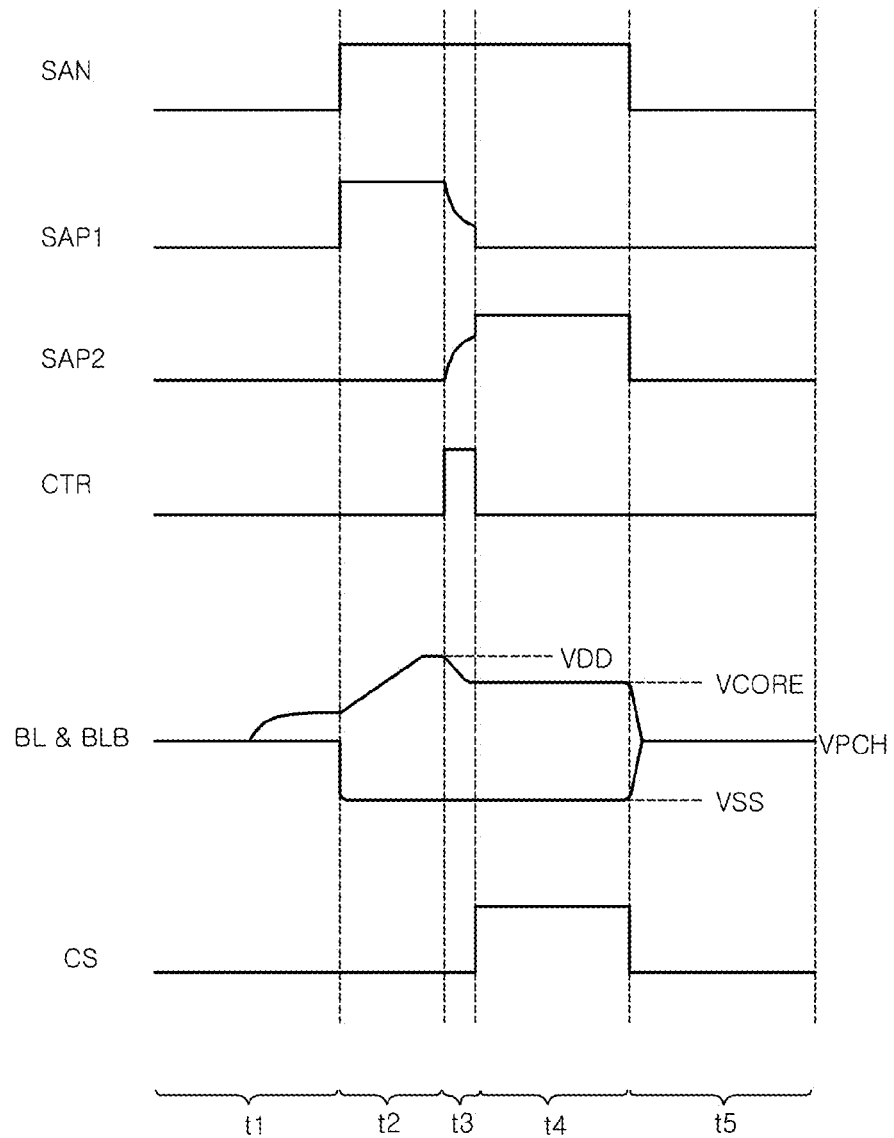
FIG. 6 is a timing diagram explaining an operating method of the semiconductor apparatus shown in FIG. 1.

Referring to FIG. 6, a timing diagram explaining an operating method of the semiconductor apparatus 10 shown in FIG. 1 is illustrated. A timing diagram of signals when the semiconductor apparatus 10 performs, for example, a read operation is shown.

An operating method of the semiconductor apparatus 10 in accordance with an embodiment of the invention will be described in detail with reference to FIGS. 1 to 3 and 6.

During a period t1, the bit line BL and the bit bar line BLB may be precharged to a precharge voltage VPCH. The precharge voltage VPCH may be a half level voltage of the second voltage VCORE. A voltage difference may be caused between the bit line BL and the bit bar line BLB due to loading of data. For instance, the voltage of the bit line BL may rise, and the voltage of the bit bar line BLB may be retained as the precharge voltage VPCH.

During a period t2, the signal generation unit 210 may output the enabled first driving signal SAP1 to the first node ND1 according to the enabled first enable signal SAP1_EN. The second transistor N2 may apply the first voltage VDD to the pull-up node RTO according to the enabled first driving signal SAP1. The signal generation unit 210 may output the disabled second driving signal SAP2 to the second node ND2 according to the disabled second enable signal SAP2_EN. The third transistor N3 does not operate according to the disabled second driving signal SAP2. The third driving signal SAN may be enabled. The fourth transistor N4 may apply the third voltage VSS to the pull-down node SB according to the enabled third driving signal SAN. Consequently, the voltage difference between the bit line BL and the bit bar line BLB may be amplified to the first voltage VDD by the sense amplifier 110 applied with the first voltage VDD and the third voltage VSS.

During a period T3, the switching unit 220 may electrically couple the first node ND1 and the second node ND2 according to the enabled control signal CTR. The switching unit 220 may form the current path from the first node ND1 to the second node ND2 according to the enabled control signal CTR. More specifically, when the control signal CTR transitions to the enabled state, because the voltage of the first node ND1 is greater than the voltage of the second node ND2, charge sharing may occur through electrical coupling between the first node ND1 and the second node ND2. At this time, the first and second tri-state inverters TIN1 and TIN2 may not output the first and second driving signals SAP1 and SAP2 according to the enabled control signal CTR.

During a period T4, the switching unit 220 may release the electrical coupling of the first node ND1 and the second node ND2 according to the disabled control signal CTR. The signal generation unit 210 may output the enabled second driving signal SAP2 to the second node ND2 according to the enabled second enable signal SAP2_EN. The third transistor N3 may apply the second voltage VCORE to the pull-up node RTO according to the enabled second driving signal SAP2. The signal generation unit 210 may output the disabled first driving signal SAP1 to the first node ND1 according to the disabled first enable signal SAP1_EN. The second transistor N2 may not operate according to the disabled first driving signal SAP1. Therefore, the voltage difference between the bit line BL and the bit bar line BLB may be amplified to the second voltage VCORE by the sense amplifier 110 applied with the second voltage VCORE and the third voltage VSS. When the voltage difference of the bit line BL and the bit bar line BLB is sufficiently amplified, the selection unit 120 may then transfer the data loaded on the bit line BL and the bit bar line BLB, to the segment data lines SIO and SIOB according to the select signal CS that is enabled. The transferred data may be output to the exterior.

During the period T5, when the data reading operation is completed, the bit line BL and the bit bar line BLB may then be precharged to the precharge voltage VPCH.

The sense amplifier 110 may perform an overdriving operation to quickly implement amplification of the bit line pair BL and BLB. For instance, the sense amplifier 110 may be applied with the first voltage VDD of which level is greater than the second voltage VCORE, before being applied with the second voltage VCORE as a final amplification voltage of the bit line pair BL and BLB. In such an instance, the first driving signal SAP1 to apply the first voltage VDD to the sense amplifier 110 and the second driving signal SAP2 to apply the second voltage VCORE to the sense amplifier 110 may be sequentially enabled. In the sense amplifier control circuit 200 in accordance with an embodiment of the invention, since the power previously used to enable the first driving signal SAP1 is used in subsequently enabling the second driving signal SAP2, the power consumption of the semiconductor apparatus 10 may be reduced as a result.

Figure 7:
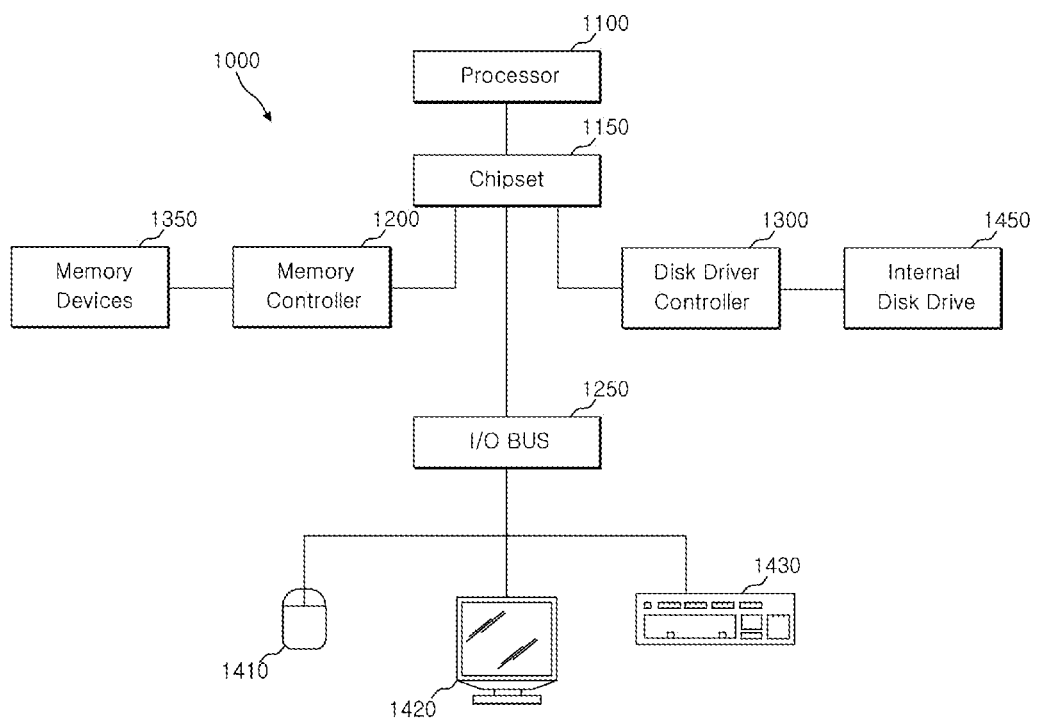
FIG. 7 illustrates a block diagram of a system employing a memory controller circuit in accordance with an embodiment of the invention.

Referring to FIG. 7, a system 1000 may include one or more processors 1100. The processor 1100 may be used individually or in combination with other processors. A chipset 1150 may be electrically coupled to the processor 1100. The chipset 1150 is a communication pathway for signals between the processor 1100 and other components of the system 1000. Other components of the system 1000 may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may also be electrically coupled to one or more memory devices 1350. The memory device 1350 may include the semiconductor apparatus 10 described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drive 1450 may communicate with each other or with the chipset 1150 using virtually any type of communication protocol.

While certain embodiments have been described above, it will be understood to those skilled in the art that the embodiments described are by way of example only. Therefore, the semiconductor apparatus and the operating method thereof described herein should not be limited based on the described embodiments. Rather, the semiconductor apparatus and the operating method thereof described herein should only be limited in light of the claims that follow when taken in conjunction with the above description and accompanying drawings.

What is claimed is:

1. A sense amplifier control circuit of a semiconductor apparatus, comprising:
   a driving unit configured to apply a first voltage to a sense amplifier in response to a first driving signal, apply a second voltage to the sense amplifier in response to a second driving signal, and apply a third voltage to the sense amplifier in response to a third driving signal; and
   a switching unit configured to directly electrically couple a first node to a second node in response to a control signal,
   wherein the first driving signal is output to the first node and the second driving signal is output to the second node.

2. The sense amplifier control circuit according to claim 1, wherein the switching unit is configured to form a current path from the first node to the second node when the control signal is in an enabled state.

3. The sense amplifier control circuit according to claim 1, wherein, when the control signal transitions to the enabled state, the first driving signal is in an enabled state and the second driving signal is in a disabled state.

4. The sense amplifier control circuit according to claim 1, wherein the second driving signal is in an enabled state and the first driving signal is in a disabled state for a predetermined time in response to the control signal transitioning to a disabled state.

5. The sense amplifier control circuit according to claim 1, further comprising:
   a signal generation unit configured to output the first driving signal to the first node in response to a first enable signal and the control signal, and output the second driving signal to the second node in response to a second enable signal and the control signal.

6. The sense amplifier control circuit according to claim 5, wherein the signal generation unit is configured to interrupt an output of the first driving signal and the second driving signal when the control signal is in the enabled state.

7. The sense amplifier control circuit according to claim 5, wherein the signal generation unit is configured to output the second driving signal in the disabled state when outputting the first driving signal in the enabled state, and output the first driving signal in the disabled state when outputting the second driving signal in the enabled state.

8. A sense amplifier control circuit of a semiconductor apparatus, comprising:
   a signal generation unit configured to output a first driving signal to a first node in response to a first enable signal and a control signal, and output a second driving signal to a second node in response to a second enable signal and the control signal; and
   a switching unit configured to directly electrically couple the first node and the second node in response to the control signal, and
   a driving unit configured to apply a first voltage to a sense amplifier in response to the first driving signal, apply a second voltage to the sense amplifier in response to the second driving signal, and apply a third voltage to the sense amplifier in response to a third driving signal.

9. The sense amplifier control circuit according to claim 8, wherein the signal generation unit is configured to interrupt an output of the first driving signal and the second driving signal when the control signal is in an enabled state.

10. The sense amplifier control circuit according to claim 8, wherein the signal generation unit is configured to output the second driving signal in a disabled state when outputting the first driving signal in an enabled state, and output the first driving signal in a disabled state when outputting the second driving signal in an enabled state.

11. The sense amplifier control circuit according to claim 8, wherein the signal generation unit is configured to output the first driving signal in the enabled state and output the second driving signal in the disabled state when the control signal transitions to the enabled state.

12. The sense amplifier control circuit according to claim 8, wherein the signal generation unit outputs the second driving signal in the enabled state and outputs the first driving signal in the disabled state, for a predetermined time in response to the control signal transitioning to a disabled state.

13. The sense amplifier control circuit according to claim 8, wherein the switching unit is configured to form a current path from the first node to the second node when the control signal is in the enabled state.

14. A method for operating a sense amplifier control circuit of a semiconductor apparatus, comprising:
   outputting from a signal generation unit an enabled first driving signal to a first node;
   applying a first voltage by a driving unit to a sense amplifier in response to the first driving signal;
   directly electrically coupling the first node and a second node by a switching unit;

outputting an enabled second driving signal from the signal generation unit to the second node; and applying a second voltage by the driving unit to the sense amplifier in response to the second driving signal, and wherein, before the electrically coupling of the first node and the second node, the method further comprises: interrupting an output of the first driving signal and the second driving signal by the signal generation unit.

15. The method according to claim 14, wherein the electrically coupling of the first node and the second node forms a current path from the first node to the second node.

16. The method according to claim 14, wherein the second driving signal is disabled when the enabled first driving signal is output.

17. The method according to claim 14, wherein the first driving signal is disabled when the enabled second driving signal is output.

18. The method according to claim 14, wherein the outputting of the enabled second driving signal further comprises:

releasing electrical coupling of the first node and the second node by the switching unit.

\* \* \* \* \*